United States Patent
Svedendahl et al.

(10) Patent No.: US 10,396,560 B2
(45) Date of Patent: Aug. 27, 2019

(54) ELECTRIC MULTI-MODE POWER CONVERTER MODULE AND POWER SYSTEM

(71) Applicant: Eltek AS, Drammen (NO)

(72) Inventors: Johan Svedendahl, Vällingby (SE); Nils Bäckman, Stockholm (SE); Sylvain Chatelet, Solna (SE); Roberto Rojas, Solna (SE)

(73) Assignee: Eltek AS, Drammen (NO)

( * ) Notice: Subject to any disclaimer, the term of this patent is extended or adjusted under 35 U.S.C. 154(b) by 158 days.

(21) Appl. No.: 15/302,100

(22) PCT Filed: Apr. 8, 2015

(86) PCT No.: PCT/EP2015/057558
§ 371 (c)(1),
(2) Date: Oct. 5, 2016

(87) PCT Pub. No.: WO2015/155203
PCT Pub. Date: Oct. 15, 2015

(65) Prior Publication Data
US 2017/0117709 A1    Apr. 27, 2017

(30) Foreign Application Priority Data

Apr. 8, 2014 (GB) .................................. 1406339.0

(51) Int. Cl.
*H02J 3/32* (2006.01)
*H02J 9/06* (2006.01)
(Continued)

(52) U.S. Cl.
CPC .............. *H02J 3/32* (2013.01); *H02J 9/061* (2013.01); *H02M 3/04* (2013.01); *H02M 5/42* (2013.01);
(Continued)

(58) Field of Classification Search
CPC ........ H02J 3/32; H02J 3/34; H02J 3/36; H02J 9/04; H02J 9/06; H02J 9/061; H02M 5/40;
(Continued)

(56) References Cited

U.S. PATENT DOCUMENTS

| | | |
|---|---|---|
| 4,012,608 A | 3/1977 | Lockard |
| 4,709,318 A | 11/1987 | Gephart et al. |
| | (Continued) | |

FOREIGN PATENT DOCUMENTS

| | | |
|---|---|---|
| CN | 101336505 A | 12/2008 |
| CN | 102893491 A | 1/2013 |
| | (Continued) | |

OTHER PUBLICATIONS

Office Action issued in corresponding Chinese Application No. 201580018593.7, dated Feb. 5, 2018 (20 pages).
(Continued)

*Primary Examiner* — Levi Gannon
(74) *Attorney, Agent, or Firm* — Osha Liang LLP (57) ABSTRACT

An electric multimode power converter module includes an AC/DC converter, including a first AC port; a DC/AC converter, including a second AC port; a DC/DC converter, including a DC port; a controller; and a communication bus interconnecting the converters. The controller includes a hardware configuration port and sets the module in the following states, based on the value read from the configuration port: a first state in which the module transfers power between the first AC port and the DC port, a second state in which the module transfers power between the DC port and the second AC port, and a third state in which the module transfers power between the AC ports and the DC port. A power supply system includes a shelf device including at least one compartment, and an electric multimode power converter module as mentioned above is inserted in the at least one compartment.

12 Claims, 9 Drawing Sheets

(51) Int. Cl.
    *H02M 5/42*     (2006.01)
    *H02M 7/68*     (2006.01)
    *H05K 5/00*     (2006.01)
    *H02M 3/04*     (2006.01)
    *H01H 15/00*     (2006.01)

(52) U.S. Cl.
    CPC ............... *H02M 7/68* (2013.01); *H05K 5/00* (2013.01); *H01H 15/005* (2013.01)

(58) Field of Classification Search
    CPC ............ H02M 5/42; H02M 5/46; H02M 7/68; H05K 5/00
    See application file for complete search history.

(56) References Cited

U.S. PATENT DOCUMENTS

| | | | |
|---|---|---|---|
| 5,010,445 | A | 4/1991 | Weinold |
| 6,487,096 | B1 | 11/2002 | Gilbreth et al. |
| 9,868,356 | B2 * | 1/2018 | An ........................ B60L 11/14 |
| 9,868,409 | B2 * | 1/2018 | Cook ..................... B60R 16/033 |
| 9,876,389 | B2 * | 1/2018 | Ogawa ...................... H02J 7/35 |
| 2006/0163878 | A1 * | 7/2006 | Anzioso ................... F02G 5/02 290/2 |
| 2007/0210652 | A1 * | 9/2007 | Tracy ...................... H02J 9/062 307/66 |
| 2010/0026093 | A1 | 2/2010 | Bleus |
| 2010/0026098 | A1 | 2/2010 | Marbach et al. |
| 2010/0105259 | A1 * | 4/2010 | Wejrzanowski ....... B63H 21/17 440/3 |
| 2011/0278933 | A1 | 11/2011 | Anderson et al. |
| 2012/0326641 | A1 * | 12/2012 | Sakai ........................ H02J 3/30 318/400.3 |
| 2015/0022001 | A1 * | 1/2015 | Goei ..................... H02J 7/0068 307/65 |
| 2016/0159250 | A1 * | 6/2016 | Meng ...................... B60M 3/06 191/2 |

FOREIGN PATENT DOCUMENTS

| | | |
|---|---|---|
| CN | 103441531 A | 12/2013 |
| EP | 1 806 819 A1 | 7/2007 |
| WO | 2012/055862 A2 | 5/2012 |
| WO | 2012/055869 A2 | 5/2012 |
| WO | 2014/114481 A1 | 7/2014 |

OTHER PUBLICATIONS

International Search Report issued in PCT/EP2015/057558, dated Jul. 14, 2015 (4 pages).
Written Opinion of the International Searching Authority issued in PCT/EP2015/057558, dated Jul. 14, 2015 (6 pages).
International Preliminary Report on Patentability from PCT/EP2015/057558 dated Apr. 20, 2016 (26 pages).
Combined Search and Examination Report for corresponding United Kingdom Application No. GB1406339.0, dated Sep. 29, 2014 (6 pages).

* cited by examiner

Fig. 5: Third state, AC-UPS, AC supply available

Fig. 6: Third state, AC-UPS, AC supply not available

Fig. 7: First state

Fig. 8: Second state

Fig. 9: Third state, AC supply from load side to AC mains

ELECTRIC MULTI-MODE POWER CONVERTER MODULE AND POWER SYSTEM

FIELD OF THE INVENTION

The present invention relates in general to power supply technology, and more specifically to an electric multi-mode power converter module and a power supply system which includes such an electric multi-mode power converter module.

BACKGROUND OF THE INVENTION

Power supply systems are used in several applications to supply a controlled and reliable power to a load.

Battery-powered DC-UPS'es are widely used to provide reliable, un-interrupted power to telecom and server equipment. AC-UPS'es are also widely used for providing un-interrupted power to datacenters, medical equipment and many types of industrial critical service equipment. AC and DC UPS'es are quite different type of equipment and are normally provided by different manufacturers, having different components, different form-fit factors and cost structures.

A prior art power supply system may comprise several power converter modules in a rack or cabinet, where the converter modules are converting an input AC power to either a controlled AC output power or to a controlled DC output power. Some converter modules convert a DC input power (for example from a battery) to either a controlled AC output power or to a controlled DC output power.

One prior art converter module is the Flatpack2 converter module, sold and marketed by Eltek ASA. This converter module may convert an input AC power (typically mains) to a controlled DC output power (typically DC power to telecommunication equipment, data center equipment, battery power storages or other DC loads). Such a converter module is often referred to as a rectifier.

Another prior art converter module is the Theia converter module, also sold and marketed by Eltek ASA. This converter module may convert an input DC power (typically solar power) to a controlled output AC power (typically AC equipment, mains etc). Such a converter module is often referred to as an inverter.

Yet another prior art converter module is the Flatpack2 DC-DC converter module, also sold and marketed by Eltek ASA. This module may convert an input DC power (typically solar power, battery power) to a controlled output DC power (typically DC power to telecommunication equipment, data center equipment or other DC loads).

The converter module may be controlled by a control module. One prior art control module is the SmartPack2 control module, sold and marketed by Eltek ASA.

Such prior art converter modules may be provided in a shelf device in a prior art power supply system. In such a system, it is important that the correct type of convert module is placed into its correct position in the correct shelf in the power system.

Such prior art power systems have certain drawbacks. Separate rectifier modules and inverter modules which fit in to shelves must be designed with slots and connectors for those specific modules. The user ends up having different shelves with modules having different purposes; thus having different modules and shelves on stock.

US 2011/0278933 describes an uninterruptible power supply (UPS) system includes an AC input configured to be coupled to an AC power source, an AC output configured to be coupled to a load, a power conversion circuit comprising a first converter circuit configured to receive power from a variably available power source, a second converter circuit coupled to the AC output, a DC link coupling the first and second converter circuits, and a switching circuit, e.g., a bypass circuit, configured to selectively couple and decouple the AC input and the AC output.

The UPS system includes first and second power conversion modules having a common architecture, including first and second converter units linked by a DC bus, a battery interface unit for coupling a battery to the DC bus and a module control unit. The module control units may be operatively associated with a system control circuit that, for example, defines interoperation of the power conversion modules in various operating modes as described below. The modules may have the same or different form factors and/or capacities. For example, the modules may have a common form factor and/or external connection configuration, and may be designed to be interchangeably installed in a system chassis.

The first converter circuit may operate as an AC-DC converter or as an DC-DC converter module. This is controlled by the module control unit.

The modules described in this publication are not very flexible, and are mostly usable for supplying an AC load.

US 2010/0026098 describes a power supply assembly including a plurality of power supply modules which can be operated in parallel and are inserted or can be inserted into a common rack. Each power supply module has an inverter branch for continuously supplying electric power to a load at the output in a load branch. The power supply assembly also has a bypass assembly that ensures the power supply when power supply through the inverter branch fails or is insufficient. The reliability of the power supply is enhanced if each of the power supply modules has a bypass which is connected to the load branch, in parallel to the inverter branch. The bypass is separated from the load branch when the inverter path works properly and in the event of failure of an inverter branch, can be automatically connected by a control circuit to the load branch in order to maintain power supply.

These modules are controlled by a control circuit preferably located inside their housing. The control circuit may communicate with control circuits of other modules. Also here the load is an AC load, and bypass is a functionality of the power supply assembly.

Also here, the modules described in this publication are not very flexible, and are mostly usable for supplying an AC load.

US 2010/0026093, corresponding to EP 1 806 819, discloses a bidirectional AC/DC/AC converter with AC input, AC output and a bidirectional DC port.

U.S. Pat. No. 6,487,096 describes a power controller providing a distributed generation power networking system in which bi-directional power converters are used with a common DC bus for permitting compatibility between various energy components. Each power converter operates essentially as a customized bi-directional switching converter configured, under the control of the power controller, to provide an interface for a specific energy component to the DC bus. The power controller controls the way in which each energy component, at any moment, will sink or source power, and the manner in which the DC bus is regulated. In this way, various energy components can be used to supply, store and/or use power in an efficient manner. The various energy components include energy sources, loads, storage devices and combinations thereof.

US 2011/278933 describes an uninterruptible power supply (UPS) system including an AC input configured to be coupled to an AC power source, an AC output configured to be coupled to a load, a power conversion circuit comprising a first converter circuit configured to receive power from a variably available power source, a second converter circuit coupled to the AC output, a DC link coupling the first and second converter circuits, and a switching circuit, e.g., a bypass circuit, configured to selectively couple and decouple the AC input and the AC output. The UPS system further includes a control circuit operatively associated with the power conversion circuit and the switching circuit and configured to cause concurrent transfer of power to a load at the AC output from the AC power source and the variably available power source via the switching circuit and the power conversion circuit, respectively.

U.S. Pat. No. 5,010,445 describes a DIP or surface mount type switch containing a built-in electronic system for direct interfacing to an electronic circuit. The DIP switch and the built-in electronic system consisting of bias resistors, active buffers, and decoding circuitry are combined as a single package.

U.S. Pat. No. 4,012,608 describes a manually actuated switch of miniature size wherein a circuit path is completed between poles of the switch by a contact having independent cantilever beams contacting a respective switch pole. The contact is carried by a manually displaceable sliding element in the form of a carriage. Movement of the carriage causes wiping of the cantilever beams over a substantial length of the switch poles.

One or more embodiments of the present invention provides a power converter module and a power supply system which are easy to configure or re-configure, in particular when it is desired to change the required mode of operation of the power converter module or power supply system.

One or more embodiments of the present invention should be easy to configure and re-configure without changing the control software and without the need of an electrician.

One or more embodiments of the present invention provides a power supply system where galvanic insulation is present between the first and second AC terminals in a cost efficient way.

One or more embodiments of the present invention should be usable in many types of applications, including applications where renewable energy may be produced periodically.

SUMMARY OF THE INVENTION

Embodiments of the invention are described herein with reference to the drawings.

In one aspect, an electric multi-mode power converter module, including: an AC/DC converter that includes a first AC port; a bi-directional DC/AC converter that includes a second AC port; a bi-directional DC/DC converter that includes a DC port; a controller; and a communication bus interconnecting the AC/DC converter, the DC/AC converter and the DC/DC converter; a DC bus for transferring power between the AC/DC converter, the DC/AC converter and the DC/DC converter; where the AC/DC converter is a bi-directional AC/DC converter; and where the controller includes a hardware configuration port and is configured to set the power converter module in one of the following states, selected in dependency on the value read from the hardware configuration port:

a first state in which the power converter module transfers power between the first AC port and the DC port, and in which the second AC port is disabled, a second state in which the power converter module transfers power between the DC port and the second AC port, and the first AC port is disabled, a third state in which the power converter module transfers power between the first AC port, the second AC port and the DC port.

In another aspect, a power supply system, including a shelf device including at least one compartment, where an electric multi-mode power converter module of the type mentioned above is inserted in the at least one compartment.

BRIEF DESCRIPTION OF THE DRAWINGS

Embodiments of the invention will now be described in detail with reference to the enclosed drawings, where.

DETAILED DESCRIPTION

Figure 1:
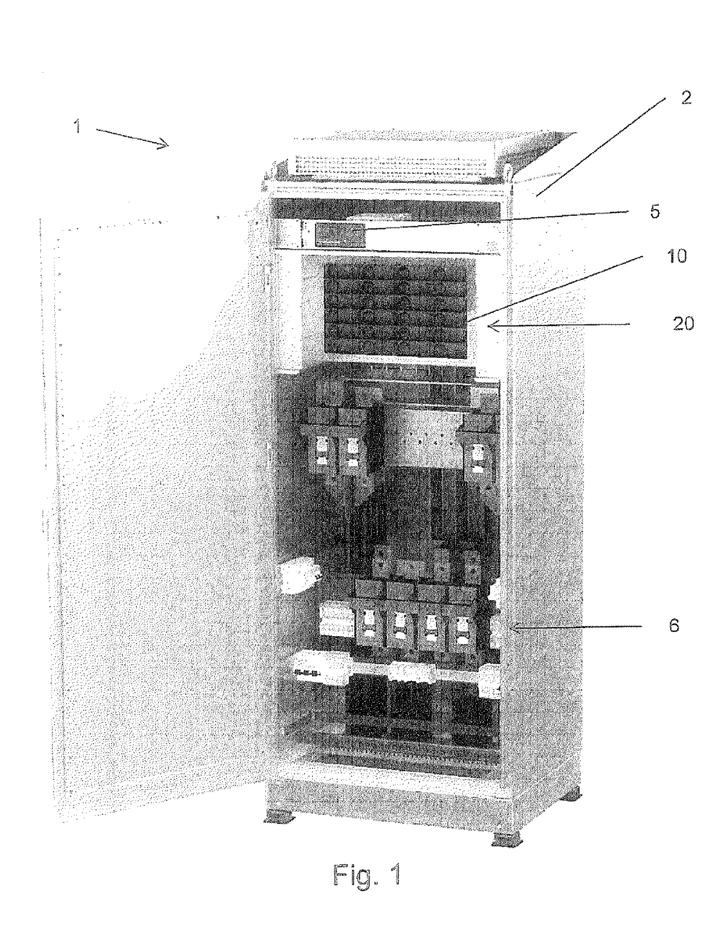
FIG. 1 is a perspective schematic view illustrating a power supply system provided within a cabinet.

FIG. 1 illustrates a power supply system 1 provided in a cabinet 2. In an upper part of the cabinet 2 shelves 20 are provided. In this example there are six shelves, one above another. For example, each shelve may have a standardized width of 19 inches and height of 1 U (rack unit).

The power supply system 1 includes a number of converter modules 10. In the illustrated example, each shelf 20 comprises four compartments, one compartment for each converter module 10. Also a control module 5 is provided in the upper part of the cabinet 2.

A "module" is here is one piece or unit of equipment which may be inserted into or taken out from the above compartments. The module comprises electrical and electronic components connected to a printed circuit board which are fitted into a chassis, typically with all its connection interfaces available on its rear side. In addition, the module often comprises a fan for blowing air through the chassis in order to remove heat participated by the components.

In the lower part 6 of the cabinet 2, batteries are provided.

All connection interfaces of the converter modules are located on the rear side of the converter modules 10, and the connectors for connection of the converter module 10 to the input AC power, the output DC power, the control module 5, etc., are located on the rear side of the shelves. Hence, it is possible to connect the converter module 10 to the shelf by pushing the converter module into the correct position of the shelf.

In power supply systems of related prior art, it was required that the cabinet 2 was configured correctly. Some prior art power supply systems had two or more different types of converter modules. It was then important that the correct type of converter module was placed into its correct position in the correct shelf.

In an aspect of the present invention, the power supply system 1 includes a number of electric multi-mode power converter module 10 of the type disclosed herein.

Figure 2:
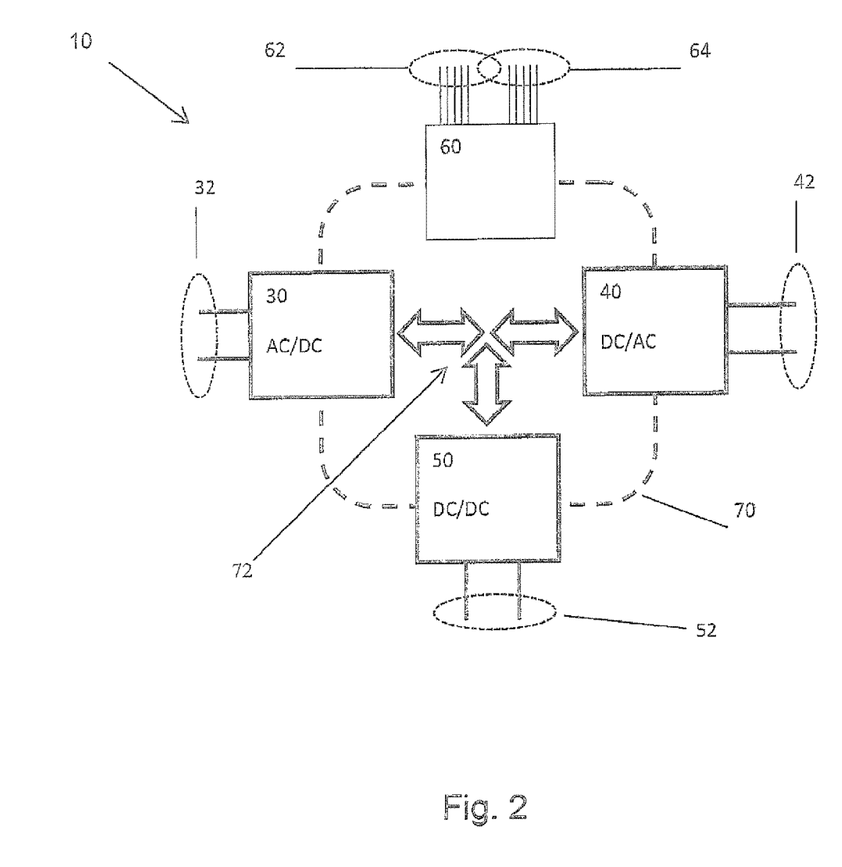
FIG. 2 is a schematic block diagram illustrating an electric multi-mode power converter module.

FIG. 2 is a schematic block diagram illustrating an electric multi-mode power converter module 10 according to the invention.

The electric multi-mode power converter module 10 comprises an AC/DC converter 30 which includes a first AC port 32. The electric multi-mode power converter module 10 further comprises a DC/AC converter 40 which includes a second AC port 42. Also, the electric multi-mode power converter module 10 comprises a DC/DC converter 50 which includes a DC port 52.

Each of the AC/DC converter 30, DC/AC converter 40 and DC/DC converter 50 may be of any suitable type, which may be selected by the skilled person. Each converter is controllable by means of external control communication means, such as a communication bus 70.

The electric multi-mode power converter module 10 further comprises a controller 60 and the communication bus 70 which interconnects the AC/DC converter 30, the DC/AC converter 40, the DC/DC converter 50, and the controller 60. Hence, the purpose of the communication bus 70 is to provide communication between the controller and the respective controllers 30, 40, 50.

The electric multi-mode power converter module 10 further comprises an internal DC bus 72 for transferring electric power between the AC/DC converter 30, the DC/AC converter 40 and the DC/DC converter 50. This internal DC bus 72 is indicated by the bi-directional arrows in FIG. 2.

The electric and electronic components of the AC/DC converter 30, the DC/AC converter 40 and the DC/DC converter 50 and the control of these circuits are described in detail in WO 2014/114481, WO 2012/055869 and WO2012/055862. It should be noted that also other topologies and methods to control them can be used in a module and a power supply system described herein.

The controller may include a microcontroller or microprocessor and a memory for holding processing instructions which causes the controller to perform certain control/configuration tasks in dependence of a predetermined operating state, which will be explained further below. Alternatively, the controller may include other type of logic circuits, e.g. programmable logic circuits, etc., which enable its functionality as disclosed herein.

The controller 60 also includes a hardware configuration port 62. The controller 60 is configured to read a value from the hardware configuration port 62.

The controller 60 is configured to set the power converter module 10 in one operating state, which is selected among a predetermined set of states. The selection of the predetermined set of states is made by the controller 60 in dependency of the value read from the hardware configuration port 62. The set of predetermined states include the following:

a first state in which the power converter module 10 transfers power between the first AC port 32 and the DC port 52, and in which the second AC port 42 is disabled, a second state in which the power converter module 10 transfers power between the DC port 52 and the second AC port 42, and the first AC port 32 is disabled, and a third state in which the power converter module 10 transfers power between the first AC port 32, the second AC port 42 and the DC port 52.

In the first state, the power converter module 10 may transfer power bi-directionally between the first AC port 32 and the DC port 5. In the second state, the power converter module 10 may transfer power bi-directionally between the DC port 52 and the second AC port 42. In the third state, the power converter module 10 may transfer power bi-directionally between any of the first AC port 32, the second AC port 42 and the DC port 52.

Disabling of a power port of a converter should be understood as preventing power flow in either direction by using the controller 60 to command switches in the converter's power circuit to stay in a high-ohmic condition and thus disconnecting a load or an energy source.

Bi-directionally transferring power by the power converter module may involve that the power stages of the power converter module's converters have a built in ability to conduct current in either direction. An example of a bi-directional DC power port is a DC-port designed to permit either charging or dis-charging a battery. The battery is receiving energy from an energy source when being charged. The battery is an energy source when being discharged. Another example of a bi-directional power port is an AC port connected to the public AC mains through which energy can be consumed from the AC mains or supplied to the public AC mains.

For instance, the value read from the hardware configuration port may be a two-bits value, resulting in four possible combinations. In this case, three of the combinations may be utilized, correspond to the first, second and third states mentioned above.

In an embodiment of the electric multi-mode power converter module 10, the hardware configuration port 62 includes a module connector SSM.

In a more specific embodiment, the module connector SSM may be connectable to a switch connector SSC.

Still more specifically, the switch connector SSC may in an embodiment be connected to a state switch SS.

In any of the above-mentioned embodiments of the electric multi-mode power converter module 10, the electric multi-mode power converter module 10 may further comprise a communication connector 64, which is communicatively connected to the communication bus 70. The communication connector 64 may be part of the controller 60 or communicatively connected to the controller 60.

In such an embodiment, the controller 60 may be configured to provide, at the communication connector 64, data which indicates the currently selected state of the power converter module 10.

In an aspect of the invention, the electric multi-mode power converter module may form part of a power supply system 1, such as the power system 1 illustrated in FIG. 1, wherein the above disclosed electric multi-mode power converter module 10 is included.

Such a power supply system comprises a shelf device 20 including at least one compartment. An electric multi-mode power converter module 10 as disclosed in any one of the embodiments mentioned above is inserted in the at least one compartment.

In an embodiment of such a power supply system 1, the hardware configuration port includes, for each electric multi-mode power converter module inserted in a compartment, a module connector SSM. Such a module connector SSM is connectable to a switch connector SSC which is further connected to a state switch SS.

More specifically, in such an embodiment of the power supply system 1, the switch connector SSC and the module connector SSM may be interconnectable.

Still more specifically, the switch connector SSC may be arranged in a rear portion of the at least one compartment in the shelf device 20. Moreover, the module connector SSM may be arranged in a rear portion of an electric multi-mode power converter module 10 inserted in the compartment.

In any one of the embodiments of the power supply system 1 disclosed above, the state switch SS may include a DIP switch which is arranged in a rear portion of the shelf device 20. Alternatively, in any such embodiment of the power supply system 1, the state switch SS may comprise a jumper connector which is arranged in a rear portion of the shelf device 20.

Figure 3:
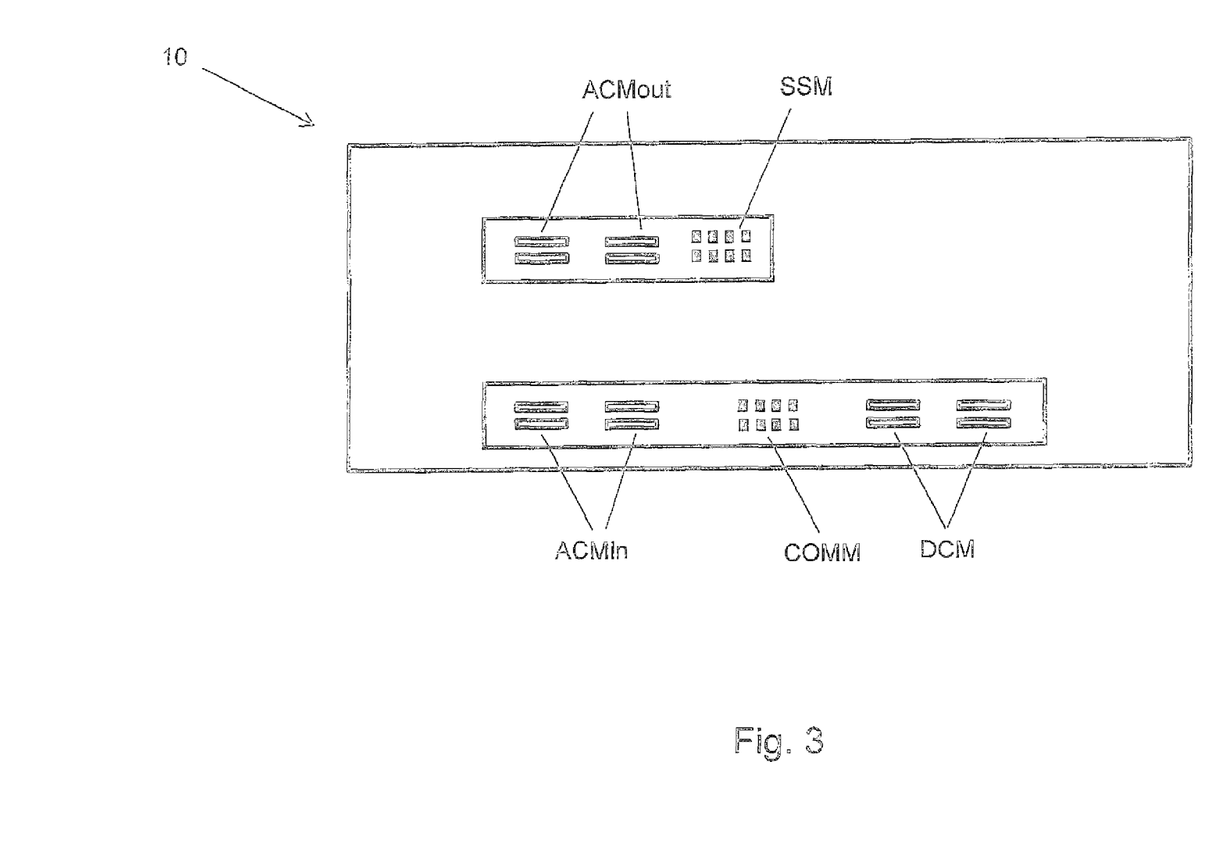
FIG. 3 is a schematic view illustrating a rear side of an electric multi-mode power converter module and its module connectors.

FIG. 3 is a schematic view illustrating a rear side of an electric multi-mode power converter module 1 and its module connectors.

The electric multi-mode power converter module 10 is adapted in such a way that it may be inserted in the at least one compartment in the shelf device 20. More specifically, the module connectors of the power converter module are interconnected with corresponding connectors provided in the compartment in the shelf device 20 when the power converter module is inserted into the compartment.

The hardware configuration port 62 of the electric multi-mode power converter module, provided at the power converter module's rear side, includes a module connector SSM. The module connector SSM may be an implementation of the hardware configuration port 62 explained above with reference to FIG. 2.

Further in FIG. 3, the connector ACMout may correspond to the first AC port 32 of the AC/DC converter 30 provided in the power converter module 10.

Likewise, the connector ACMin may correspond to the second AC port 42 of the DC/AC converter 40 provided in the power converter module 10.

The connector DCM may correspond to the DC port 52 of the AC/DC converter 50 provided in the power converter module 10.

The connector COMM may correspond to the communication connector 64 which is communicatively connected to the communication bus 70.

Figure 4:
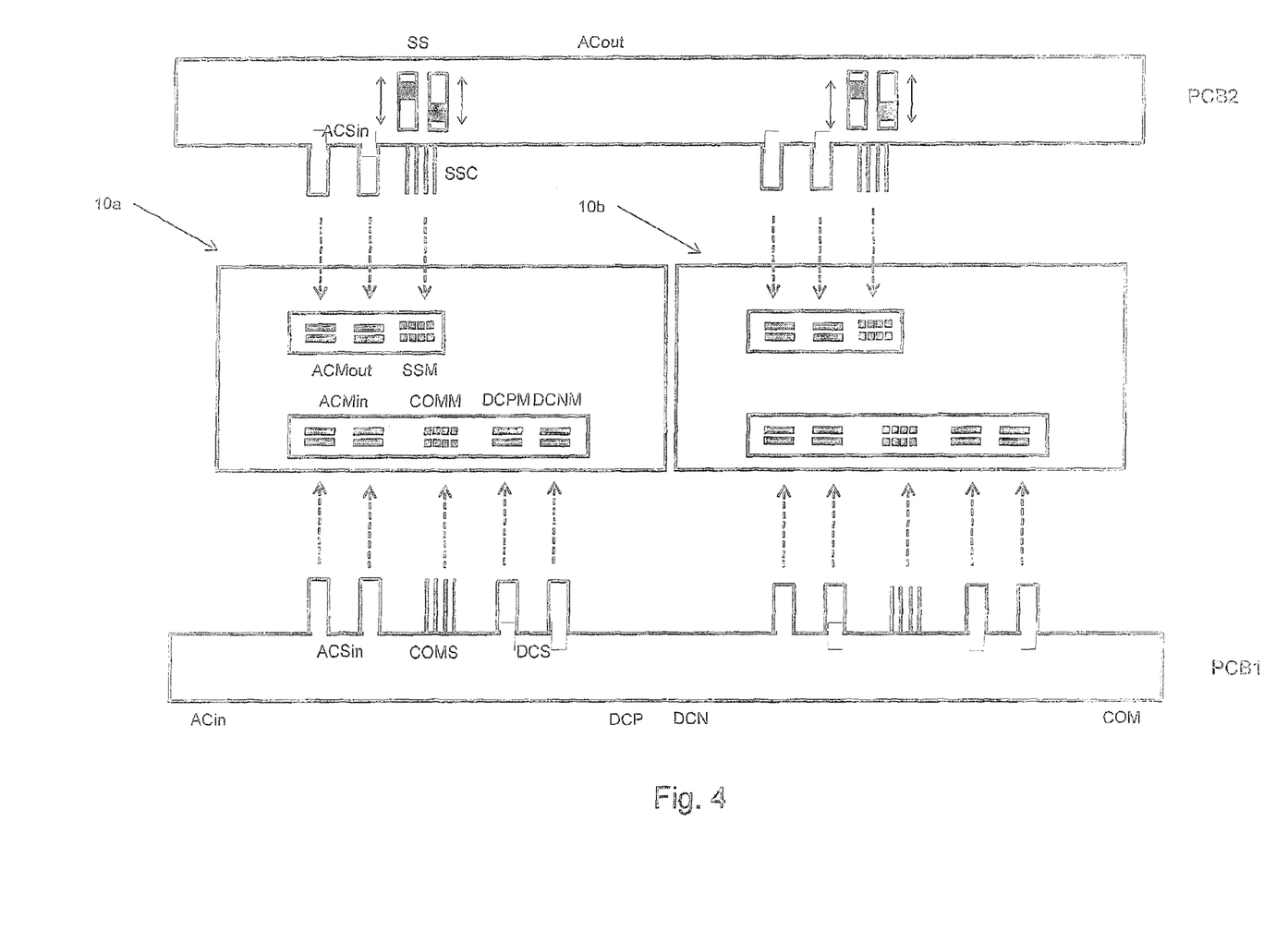
FIG. 4 is a schematic view illustrating two electric multi-mode power converter modules and their connection to first and second printed circuit boards.

FIG. 4 is a schematic view illustrating two electric multi-mode power converter modules and their connection to first and second printed circuit boards.

Each electric multi-mode power converter module 10*a*, 10*b* is adapted in such a way that it may be inserted into a respective compartment of the shelf device 20. In the same way as has already been explained with reference to FIG. 3 above, the module connectors of each power converter module 10*a*, 10*b* are interconnected with corresponding connectors provided in the compartment in the shelf device 20 when the respective power converter module is inserted into the compartment.

The connectors SSM, ACMout, ACMin and COMM correspond to their equally denoted counterparts described with reference to FIG. 3 above. The connectors DCPM DCNM correspond to connector DCM (DC port 52) as described with reference to FIG. 3 above.

PCB1 and PCB2 denote respective first and second printed circuit boards provided in the shelf device 20. During use, an electric multi-mode power converter module 10 is inserted in the at least one compartment.

During this insertion the module connector SSM of the power converter module 10*a* is connected to a switch connector SSC in the first printed circuit board PCB1. The switch connector SSC is further connected to a state switch SS provided in the first printed circuit board. The state switch SS may advantageously include a DIP switch which is arranged in a rear portion of the shelf device 20.

The switch connector SSC is arranged in a rear portion of the at least one compartment in the shelf device 20. The module connector SSM is arranged in a rear portion of the electric multi-mode power converter module 10*a* which is inserted in the compartment.

In a corresponding way, when the power converter module 10*a* is inserted in the compartment, the connector ASMout is connected to a connector ACSin provided at the first printed circuit board PCB1.

Also, when the power converter module 10*a* is inserted in the compartment, the connector ACMin is connected to a connector ACSin provided at the second printed circuit board PCB2. Further, the connector DCPM DCNN is connected to the connector DCS provided at the second printed circuit board PCB2, and the connector COMS is connected to the connector COMM provided at the second printed circuit board PCB2.

Corresponding connections are made between connectors on the rear side of the second power converter module 10*b* when it is inserted into the second compartment of the shelf device 20, as has been schematically indicated by non-labeled arrows in FIG. 4.

The resulting power system 1, which includes the multi-mode power converter modules 10, may be used either as an AC-UPS, or a DC-UPS, or both at the same time. The system is built with converter modules 10 which each may be configured to behave as a rectifier in a DC-UPS, or behave as an inverter in an AC-UPS. Each converter module 10 is programmed by an external HW switch (the hardware configuration port 62) to provide any of the two functions, or both at the same time.

In some aspects of the presently disclosed power converter module and power supply system, the configuration of the power converter module is independent of the module itself. Rather, the configuration depends on the state of a hardware switch provided in a slot incorporated in the power shelf. The module is connected to the HW switch when it is inserted into its position in the power shelf. One connector in the rear of the module is then connecting to a mating connector in the power shelf. In this way it is determined if the power converter module is programmed to be a rectifier, an inverter, or both.

The invention provides a power converter module and a power supply system which may be reconfigured in an easy way if the required mode of operation needs to be changed. An example of such a need for changing the required mode of operation is if a provider of data center services wants to change the server equipment from a −48V fed server to a 230 VAC fed server.

Another example of the need for flexibility is that the data center host may not even know in advance, what equipment a potential customer prefers. The service provider needs therefore to be prepared for both type of power supply options, DC or AC. An advantage of the invention is that the power converter module and power supply system may be purchased and installed before the decision on whether AC or DC power should actually be used, may be made at a later point of time.

EXAMPLE 1

In the first example, the power supply system 1 comprising several modules 10 is used to supply power from the AC mains to both a DC load and an AC load. The first AC port 32 is connected to the AC mains, the second AC port 42 is connected to the AC load and the DC port 52 is connected to the battery and the DC load (i.e. the battery is connected in parallel with the battery) outside of the module 10. Here, the respective modules 10 are set in their third state by means of their respective hardware configuration ports.

Figure 5:
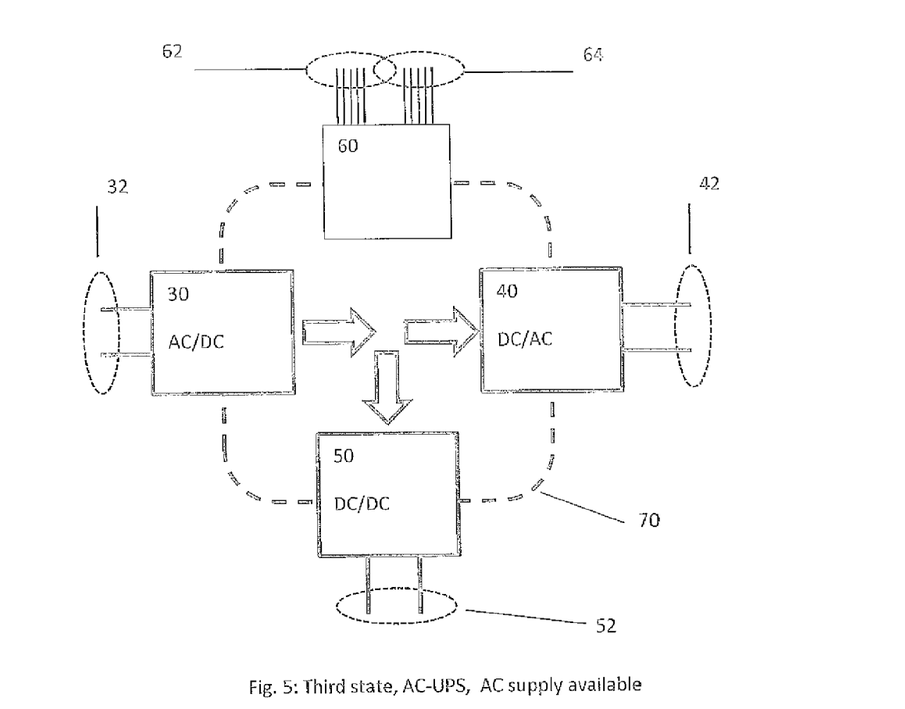
FIG. 5-9 illustrates the power flow through the module in different states and under different conditions.

As long as the AC mains is supplying power, the AC/DC converter will supply power to both the DC/DC converter and to the DC/AC converter. The DC/DC converter will supply power to the battery and the DC load, while the DC/AC converter will supply power to the AC load. The power flow in this situation is indicated in FIG. 5.

Figure 6:
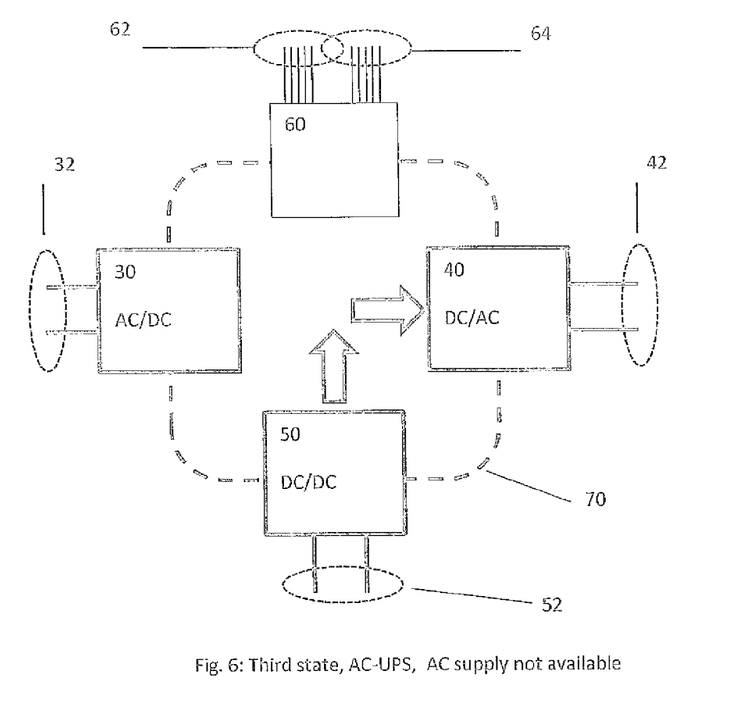

In case the AC mains is not supplying power (AC mains failure), the DC/DC converter will supply power from the battery to the DC/AC converter and further to the AC load. The battery will supply power directly to the DC load. The power flow in this situation is indicated in FIG. 6.

Example 1 is standard AC-UPS functionality.

EXAMPLE 2

In the second example, the power supply system 1 comprising several modules 10 is used to supply power from a very weak or faulty AC mains to both a DC load and an AC load. With such an AC mains, there is an increased risk that voltage and/or current spikes may damage the converters or even the load (in particular the AC load, since galvanic insulation is only present in the DC/DC converter).

Figure 7:
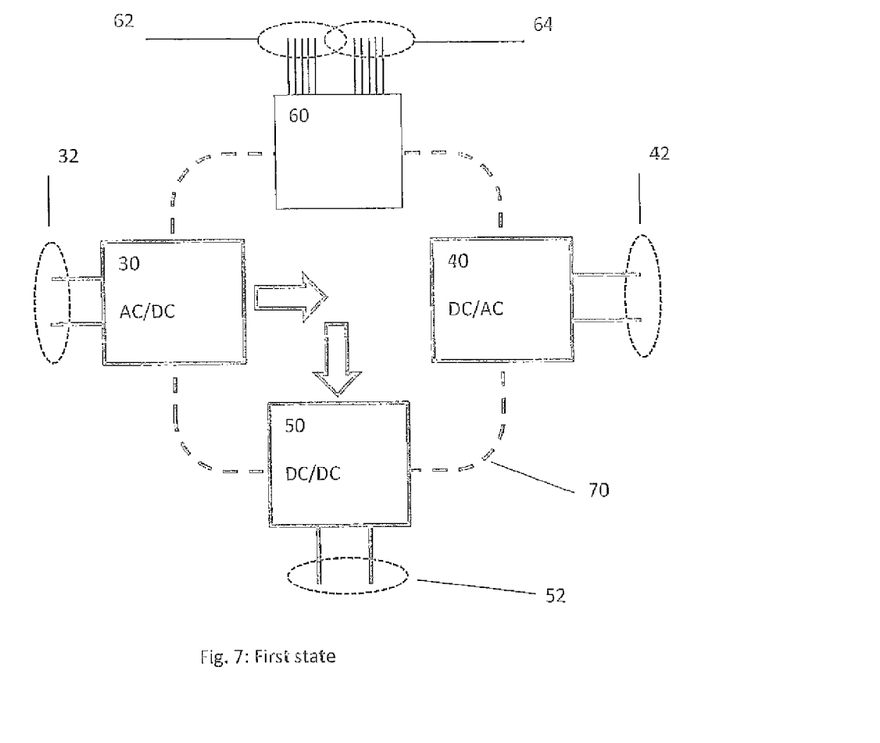

Here, half of the modules 10 are set in first state by means of their respective hardware configuration ports, and the remaining modules 10 are set in their second state by means of their respective hardware configuration ports. Consequently, when the AC net is supplying power, the AC/DC converter is supplying power to the battery and the DC load by means of the first half of the modules. The power flow in the first state is indicated in FIG. 7.

Figure 8:
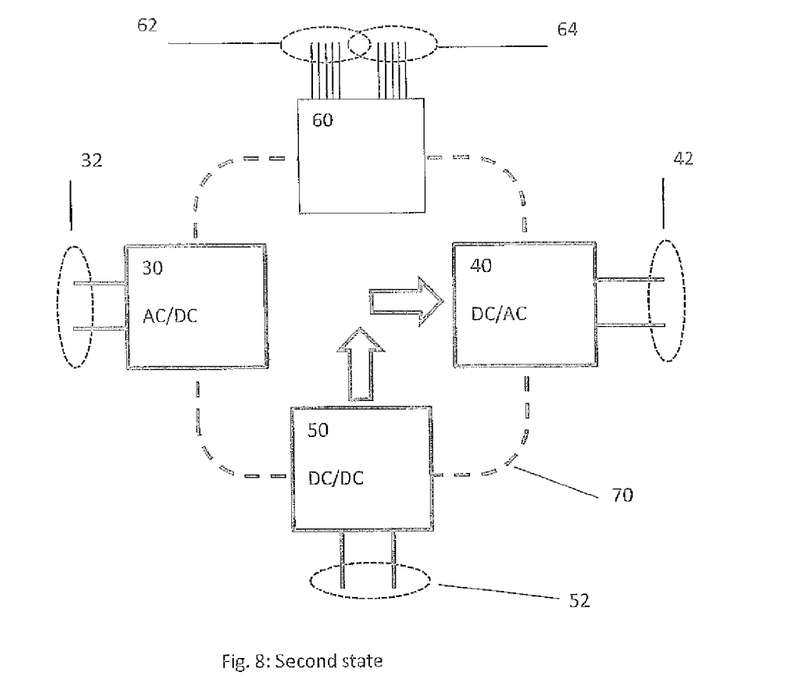

The second half of the modules will use the DC/DC converter to supply power from the battery to the DC/AC converter and further to the AC load. The power flow in the second state is indicated in FIG. 8. Hence, galvanic insulation between the AC mains and the AC load is achieved.

In case the AC mains is not supplying power (AC mains failure), the first half of modules will not do anything, while the second half of modules will continue as before by using battery power. The battery will supply power directly to the DC load.

EXAMPLE 3

In the third example, the power supply system 1 comprising several modules 10 is used in a building, where the building is connected to the AC mains, but where the building also is equipped with a solar cell system (not shown). The solar cell system includes inverters (not shown) for converting the DC voltage produced by the solar cells to AC voltage for use in the building.

The load in the building is mainly AC load, but DC load may also be present.

Here, the first AC port 32 is connected to the AC mains outside of the building. The second AC port 42 is connected to the AC network inside the building (i.e. both to the AC load and also to the solar cell AC supply. The DC port 52 is connected to the battery and the DC load (i.e. the battery is connected in parallel with the battery). Here, the respective modules 10 are set in their third state by means of their respective hardware configuration ports.

During night, there is no supply of AC power from the solar cell system. Here, the power supply system 1 is functioning according to example 1 above, i.e. as indicated in FIG. 5 or 6, depending on the presence of the AC mains.

During a day with a lot of sun-light, the solar cell system may produce more AC power than consumed by the AC load in the AC network inside the building. Here, the power supply system, due to its bi-directional functionality, supplies power from the DC/AC-converter 40 to the AC/DC converter 30 and further to the AC mains and to the DC-DC converter 50 in order to charge the batteries. The power flow in this situation is indicated in FIG. 9.

Figure 9:
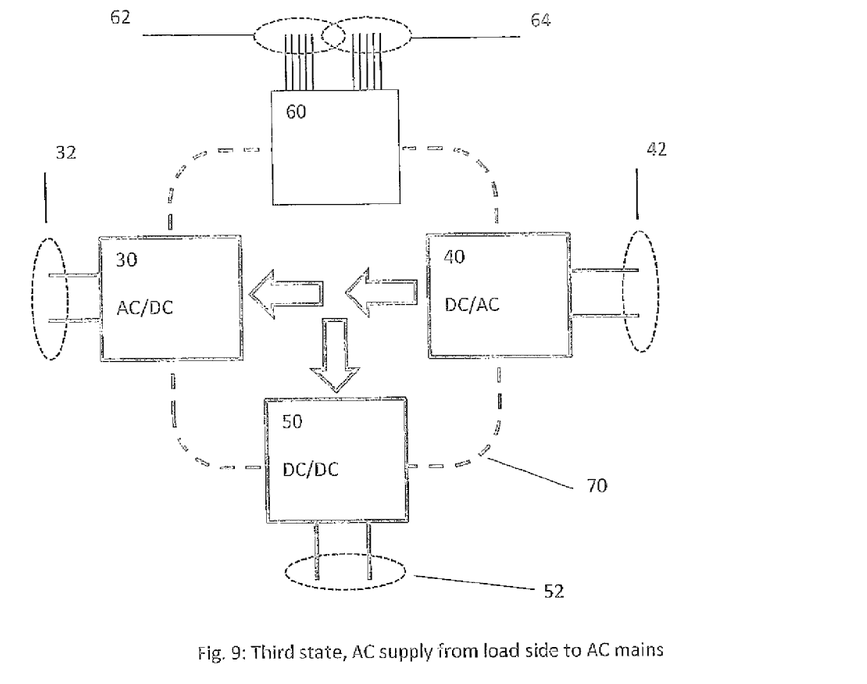

It should be noted that in the above FIGS. 5, 7 and 9, if the battery is fully charged and there is no DC load, no power will flow through the DC/DC converter 50.

The invention has been explained herein by non-limiting examples. The scope of the invention is determined by the appended claims.

The invention claimed is:

1. An electric multi-mode power converter module, comprising:
   a bi-directional AC/DC converter, comprising a first AC port;
   a bi-directional DC/AC converter, comprising a second AC port;
   a bi-directional DC/DC converter, comprising a DC port;
   a controller;
   a communication connector that is communicatively connected to a communication bus; and
   a DC bus for transferring power between the AC/DC converter, the DC/AC converter and the DC/DC converter;
   wherein the controller, the AC/DC converter, the DC/AC converter, and the DC/DC converter are interconnected;
   wherein the power converter module transfers power between the first AC port and the DC port and where the power converter module transfers power between the DC port and the second AC port;
   wherein the communication bus is interconnecting the controller, the AC/DC converter, the DC/AC converter, and the DC/DC converter;
   wherein the controller comprises a hardware configuration port and is configured to set the power converter module in one of the following states, selected in dependency on the value read from the hardware configuration port:
      a first state in which the power converter module transfers power between the first AC port and the DC port, and in which the second AC port is disabled,
      a second state in which the power converter module transfers power between the DC port and the second AC port, and the first AC port is disabled,
      a third state in which the power converter module transfers power between any of the first AC port, the second AC port and the DC port;
   wherein the hardware configuration port includes a module connector; and
   wherein the first AC port, the second AC port, the DC port, the communication connector, and the hardware configuration port are all located on a rear side of the converter module.

2. The electric multi-mode power converter module according to claim 1, wherein the module connector is connectable to a switch connector.

3. The electric multi-mode power converter module according to claim 2, wherein the switch connector is connected to a state switch.

4. The electric multi-mode power converter module according to claim 1, wherein the controller is configured to provide, at the communication connector, data indicating the currently selected state of the power converter module.

5. A power supply system, comprising a shelf device including at least one compartment, wherein an electric multi-mode power converter module as set forth in claim 1 is inserted in the at least one compartment.

6. The power supply system according to claim 5, wherein, for each electric multi-mode power converter module, the module connector is connectable to a switch connector which is further connected to a state switch.

7. The power supply system according to claim 6, wherein the switch connector and the module connector are inter-connectable.

8. The power supply system according to claim 7, wherein the switch connector is arranged in a rear portion of the at least one compartment in the shelf device, and
wherein the module connector is arranged in a rear portion of an electric multi-mode power converter module inserted in the compartment.

9. The power supply system according to claim 6, wherein the state switch includes a DIP switch arranged in a rear portion of the shelf device.

10. The power supply system according to claim 6, wherein the state switch comprises a jumper connector, arranged in a rear portion of the shelf device.

11. A power supply system, comprising a shelf device comprising at least two compartments, wherein a first and a second electric multi-mode power converter modules as set forth in claim 1 are inserted into two of the compartments, where:

the first module is configured to be set in the first state by means of the hardware configuration port, where the first AC port of the first module is connected to AC mains and where the DC port of the first module is connected to a battery;
the second module is configured to be set in the second state by means of the hardware configuration port, where the DC port of the second module is connected to the battery and where the second AC port of the second module is connected to an AC load.

12. A power supply system for connection between a first AC network and a second AC network, the system comprising a shelf device including at least one compartment, wherein an electric multi-mode power converter module as set forth in claim 1 is inserted in the at least one compartment, where:

the first AC port is connected to the first AC network;
the second AC port is connected to the second AC network;
the module is configured to be set in the third state by means of the hardware configuration port;
the controller is configured to control the power transfer from the first AC port to the second AC port when the production of AC power in the second AC network is below a predetermined threshold, and where the controller is configured to transfer power from the second AC port to the first AC port when the production of AC power in the second AC network is above the predetermined threshold.

* * * * *